United States Patent
Banine et al.

(10) Patent No.: US 7,193,229 B2
(45) Date of Patent: Mar. 20, 2007

(54) LITHOGRAPHIC APPARATUS, ILLUMINATION SYSTEM AND METHOD FOR MITIGATING DEBRIS PARTICLES

(75) Inventors: Vadim Yevgenyevich Banine, Helmond (NL); Levinus Pieter Bakker, Helmond (NL); Aleksey Yurievich Kolesnychenko, Helmond (NL); Johannes Hubertus Josephina Moors, Helmond (NL); Frank Jeroen Pieter Schuurmans, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 33 days.

(21) Appl. No.: 11/022,943

(22) Filed: Dec. 28, 2004

(65) Prior Publication Data

US 2006/0138350 A1    Jun. 29, 2006

(51) Int. Cl.
*H01J 49/00*    (2006.01)
(52) U.S. Cl. ............... 250/504 R; 355/30; 355/67; 355/77
(58) Field of Classification Search ............... None
See application file for complete search history.

(56) References Cited

U.S. PATENT DOCUMENTS 4,872,189 A   10/1989   Frankel et al.
5,023,897 A   6/1991    Neff et al.
5,459,771 A   10/1995   Richardson et al.
5,504,795 A   4/1996    McGeoch
5,577,092 A   11/1996   Kublak et al.
6,614,505 B2 *  9/2003  Koster et al. ............ 355/30

FOREIGN PATENT DOCUMENTS

EP    1 223 468 A1    7/2002

* cited by examiner

*Primary Examiner*—David Vanore
(74) *Attorney, Agent, or Firm*—Pillsbury Winthrop Shaw Pittman, LLP

(57) ABSTRACT

A lithographic apparatus includes a source for generating radiation, an illumination system for conditioning the radiation, a patterning device for patterning the conditioned radiation, and a projection system for projecting the patterned radiation onto a target portion of a substrate. The illumination system includes a debris mitigating system for mitigating debris particles that are released with the generation of radiation, and an optical system for collecting the radiation. The debris mitigation system is arranged to directly evaporate the debris particles, or to directly charge the debris particles, or to directly produce a plasma out of the debris particles, or any combination thereof, in a path along which the radiation propagates from the source to the optical system.

43 Claims, 4 Drawing Sheets

LITHOGRAPHIC APPARATUS, ILLUMINATION SYSTEM AND METHOD FOR MITIGATING DEBRIS PARTICLES

FIELD

According to an aspect of the invention, there is provided an apparatus that includes a source for generating radiation, a debris mitigating system for mitigating debris particles that are released with the generation of radiation, and an optical system for collecting the radiation. The debris mitigation system is arranged to directly evaporate the debris particles, or to directly charge the debris particles, or to directly produce a plasma out of the debris particles, or any combination thereof, in a path along which the radiation propagates from the source to the optical system.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" -direction), while synchronously scanning the substrate parallel or anti-parallel to this direction. It is also possible to transfer the pattern from the patterning device to the substrate by imprinting the pattern onto the substrate.

In a lithographic apparatus, the size of features that can be imaged onto the substrate is limited by the wavelength of the projection radiation. To produce integrated circuits with a higher density of devices, and hence higher operating speeds, it is desirable to image smaller features. While most current lithographic projection apparatus employ ultraviolet light generated by mercury lamps or excimer lasers, it has been proposed to use shorter wavelength radiation, in the range of 5 to 20 nm, in particular around 13 nm.

Such radiation is termed extreme ultra violet (EUV) or soft X-ray and possible sources include, for example, laser produced plasma sources, discharge plasma sources, or synchrotron radiation from electron storage rings. These types of radiation require that the beam path in the apparatus be evacuated to avoid beam scatter and absorption. Because there is no known material suitable for making a refractive optical element for EUV radiation, EUV lithographic apparatus should use mirrors in the radiation (illumination) and projection systems. Even multilayer mirrors for EUV radiation have relatively low reflectivities and are highly susceptible to contamination, which may further reduce their reflectivity and hence the throughput of the apparatus. This may impose further specifications on the vacuum level to be maintained and may necessitate especially that hydrocarbon partial pressures be kept very low.

In a typical discharge plasma source, plasma is formed by an electrical discharge. The plasma may then be caused to compress so that it becomes highly ionized and reaches a very high temperature, causing the emission of EUV radiation. The material used to produce the EUV radiation is typically xenon gas or lithium vapor, although also other gases and vapors such as krypton gas or tin or water vapor may be used. However, these gases may have a relatively high absorption of radiation within the EUV range and/or may be damaging to optics further downstream of the projection beam and their presence should therefore be minimized in the remainder of the lithographic apparatus. A discharge plasma source is disclosed, for example, in U.S. Pat. No. 5,023,897 and U.S. Pat. No. 5,504,795, both of which are incorporated herein by reference.

In a laser produced plasma source a jet of, for example, (clustered) xenon may be ejected from a nozzle, for example, from an ink-jet like nozzle as droplets or thin wire. At some distance from the nozzle, the jet is irradiated with a laser pulse of a suitable wavelength for creating a plasma that subsequently will radiate EUV radiation. Other materials, such as water droplets, ice particles, lithium or tin, etc. may also be ejected from a nozzle and be used for EUV generation. In an alternative laser-produced plasma source an extended solid (or liquid) material is irradiated to create a plasma for EUV radiation. Laser produced plasma sources are, for example, disclosed in U.S. Pat. No. 5,459,771, U.S. Pat. No. 4,872,189, and U.S. Pat. No. 5,577,092, all of which are incorporated herein by reference.

During generation of EUV radiation, particles are released. These particles, hereinafter referred to as debris particles, include ions, atoms, molecules, and small droplets. These particles should be mitigated, in the sense that a possible detrimental effect of these particles on the performance and the lifetime of the lithographic apparatus and, in particular, the illumination and projection system, be minimized. European Patent Application Publication No. 1 223 468 A1, which is incorporated herein by reference, describes a lithographic apparatus that has a contaminant barrier that includes ionization means for ionizing a gas that is provided in a region through which the radiation propagates from the source to the illuminator. This gas is provided in order to be ionized.

SUMMARY

It is desirable to provide a lithographic apparatus in which the separate provision of a gas in the region through which the radiation propagates from the source to the illuminator is much less relevant to the mitigation of debris particles in that region.

It is further desirable to provide an illumination system in which the separate provision of a gas in the region through which the radiation emanating from a radiating source propagates to the illuminator is much less relevant to the mitigation of debris particles in that region.

It is further desirable to provide a method for mitigating debris particles that is much less dependant on the provision of a gas as compared to the method described in EP 1 223 468 A1.

According to an aspect of the invention, there is provided a lithographic apparatus that includes a source for generating radiation, an illumination system for conditioning the radiation, a patterning device for patterning the conditioned radiation, and a projection system for projecting the patterned radiation onto a target portion of a substrate. The illumination system includes a debris mitigating system for mitigating debris particles that are released with the generation of radiation, and an optical system for collecting the radiation. The debris mitigation system is arranged to directly evaporate the debris particles, or to directly charge the debris particles, or to directly produce a plasma out of the debris particles, or any combination thereof, in a path along which the radiation propagates from the source to the optical system.

According to an aspect of the invention, there is provided an illumination system configured to condition radiation in a lithographic apparatus. The illumination system includes a debris mitigating system for mitigating at least some debris particles that are released when the radiation is generated, and an optical system for collecting the radiation. The debris mitigation system is arranged to directly evaporate the debris particles, or to directly charge the debris particles, or to directly produce a plasma out of the debris particles, or any combination thereof, in a path along which the radiation propagates from a source generating the radiation to the optical system.

According to an aspect of the invention, there is provided a method for mitigating at least some debris particles released during generation of radiation in a path along which the radiation propagates from a radiation source to an optical system. The method includes directly evaporating the debris particles, or directly charging the debris particles, or directly producing a plasma out of the debris particles, or any combination thereof, in that path.

According to an aspect of the invention, there is provided a lithographic apparatus that includes a source for generating radiation, an illumination system for conditioning the radiation, a patterning device for patterning the conditioned radiation, and a projection system for projecting the patterned radiation onto a substrate. The illumination system includes a debris mitigating system for mitigating debris particles that are released with the generation of radiation, and an optical system for collecting the radiation. The debris mitigating system is constructed and arranged to mitigate the debris particles without use of another gas that is separate from the debris particles.

As according to each of the above-mentioned aspects of the invention, debris particles may be evaporated directly, be charged directly, or directly transformed into a plasma, there is at least from this point of view no need for the provision of another gas separate from the debris particles itself.

As according to all the aspects of the invention above, the particles are either directly evaporated directly charged, or directly charged into a plasma, the particles may become smaller, thereby resulting in less impact when hitting an optical component and/or will easily be deflected from their original course by an electric and/or magnetic mechanism, and are, as such, able to be mitigated.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
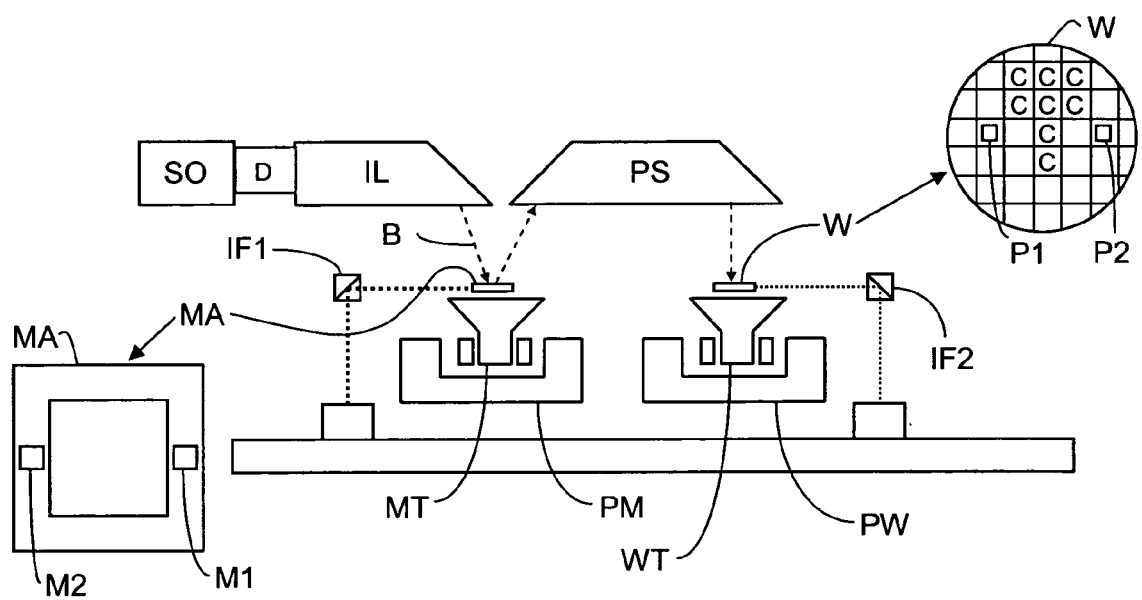
FIG. 1 depicts schematically a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as, for example, whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example, with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate, for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type in which at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases, the source may be an integral part of the lithographic apparatus, for example, when the source is a mercury lamp. The source SO and the illuminator IL, together with the beam delivery system, if required, may be referred to as a radiation system. In a path along which the radiation propagates from the source to the illuminator or the optical system, in general, a debris mitigating system D is situated, either as part of the lithographic apparatus, as part of the source, or as a separate entity. It is also possible to regard the source SO and the debris mitigating system D as part of a radiation system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus may be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally, a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
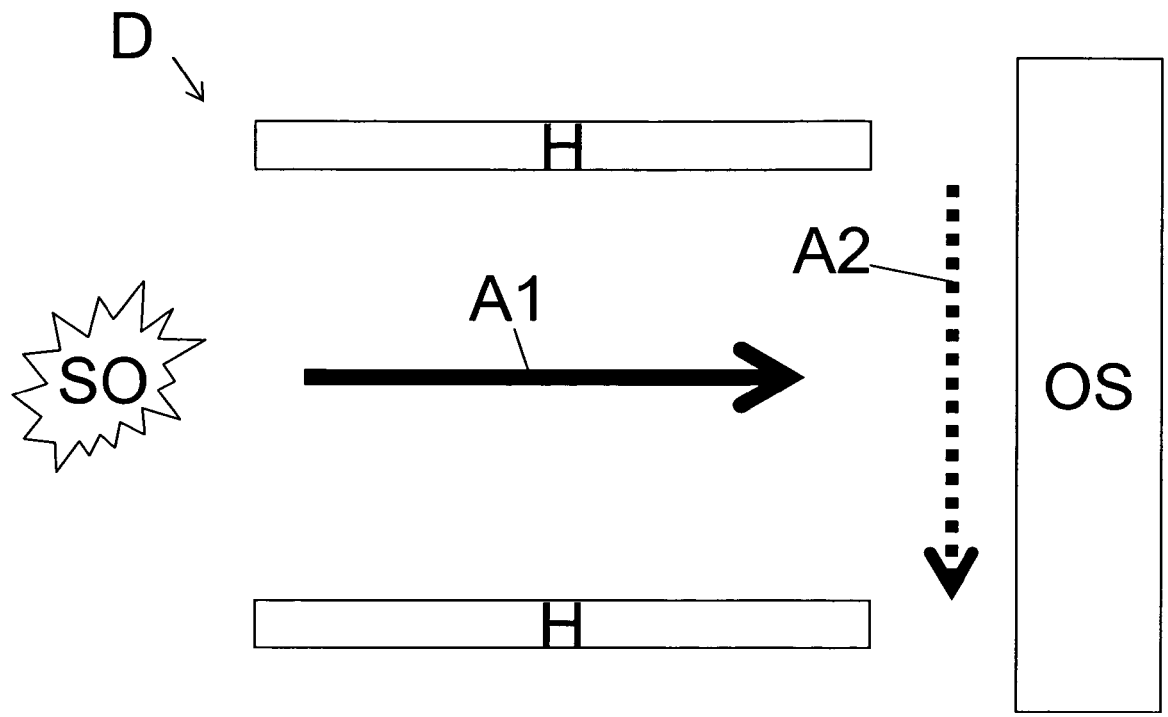
FIG. 2 schematically depicts a part of the lithographic apparatus of FIG. 1 according to an embodiment of the invention.

FIG. 2 depicts in more detail a part of a lithographic apparatus that includes a source SO for generating radiation, a debris mitigating system D for mitigating at least some debris particles that are released due to generating radiation, and an optical system OS for collecting radiation. The debris mitigating system D shown in FIG. 2 is arranged to directly evaporate at least some of the debris particles in a path along which the radiation propagates from the source to the optical system. The direction of this path is schematically shown by the arrow A1. The debris mitigating system D includes a heater H for heating the debris particles. It is possible that the heater includes an oven. The debris mitigating system D may be configured so that the path along which the radiation propagates from the source to the optical system extends through the oven. Furthermore, the debris mitigating system D may apply heat insulating materials so as to ensure that the heat applied will be used efficiently. The heater is arranged to supply thermal energy to the debris particles in the path so that these particles, in particular particles having dimensions of the order of nanometers up to micrometers, evaporate.

Figure 3:
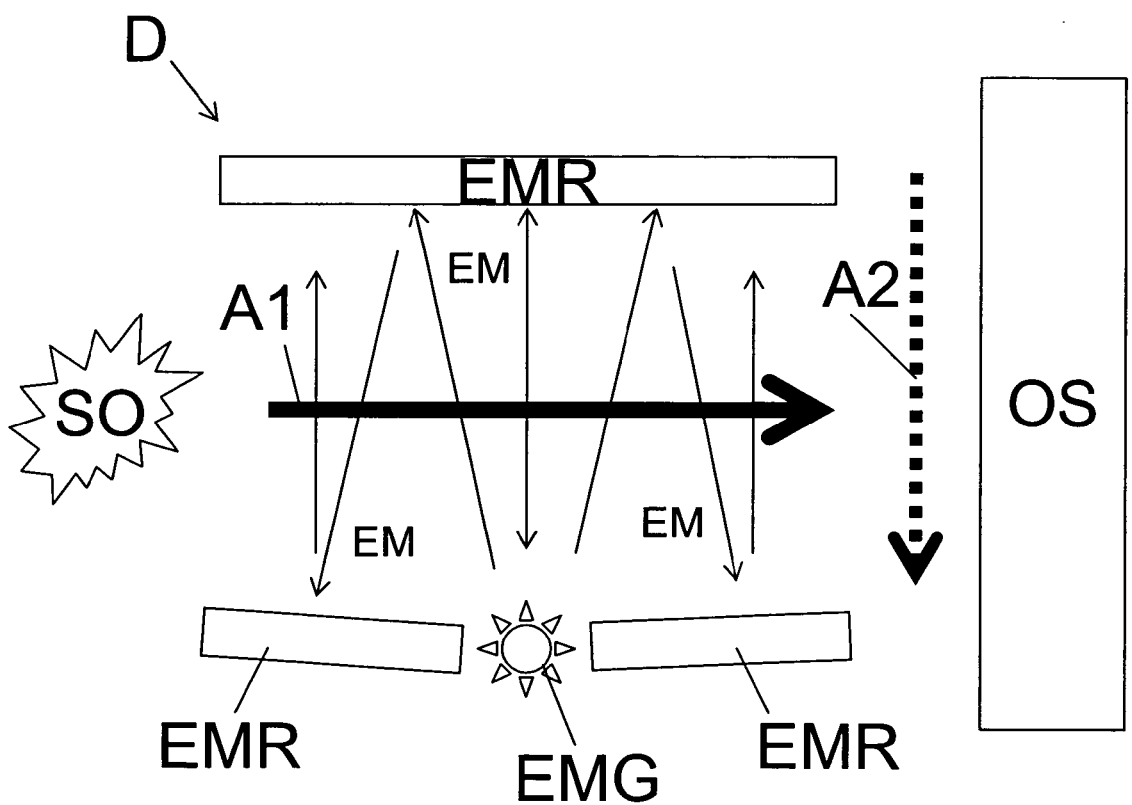
FIG. 3 schematically depicts a part of the lithographic apparatus of FIG. 1 according to an embodiment of the invention.

An embodiment of a part of a lithographic apparatus according to the invention is schematically shown in FIG. 3. In this embodiment, the debris mitigating system D includes an EM generator EMG for generating electromagnetic radiation. The EM generator may include a flash lamp, a laser, or an I-line lamp. The debris mitigating system D according to a particular embodiment is configured so that the EM generator EMG is capable of supplying power in a range of about 100 to about 4000 watts, or more in particular around 200 watts. It turns out that micronsized particles of Sn (tin) evaporate in less than one microsecond when heated by a thermal energy source providing about 200 watts. If the particles are smaller, the time needed for complete evaporation of such a particle is even shorter.

In this embodiment, the debris mitigating system may employ EM radiation reflectors EMR for reflecting electromagnetic radiation so that the electromagnetic radiation, after having crossed the path once, is returned back towards the path.

The embodiment works as follows. The electromagnetic radiation generator EMG produces electromagnetic radiation that causes the debris particles present in the path represented by arrow A1 to absorb the electromagnetic radiation and be evaporated. The electromagnetic radiation that is not being absorbed by the debris particles, due to a lack of interaction with the debris particles, may be reflected by the electromagnetic radiation reflectors EMR and, as such, have another opportunity to be absorbed by the debris particles. As shown in FIG. 3, the mutual orientation of the electromagnetic radiation reflectors and the position of the EM generator EMG with respect to the electromagnetic radiation reflectors EMR may be chosen so that the electromagnetic radiation will be maintained between the electromagnetic radiation reflectors EMR as long as possible so as to increase the likelihood that the electromagnetic radiation is absorbed by debris particles in the path represented by arrow A1. In FIG. 3, the electromagnetic radiation is represented by arrows EM.

For both the embodiment employing the heater H and the embodiment employing the EM generator EMG it applies that debris particles, usually moving along the path with a speed of about tens of meters per second—and, if the particles are smaller even up to several hundreds of meters per second—, may be evaporated within one microsecond. The particles can therefore be evaporated when traveling over a distance of about 1 centimeter. This allows for mitigating of debris particles close to the source SO.

It should be understood that the electromagnetic radiation may be chosen so that debris particles will be charged via a process of photo-ionization. Charged particles may be easily mitigated, as further explained below.

Figure 4:
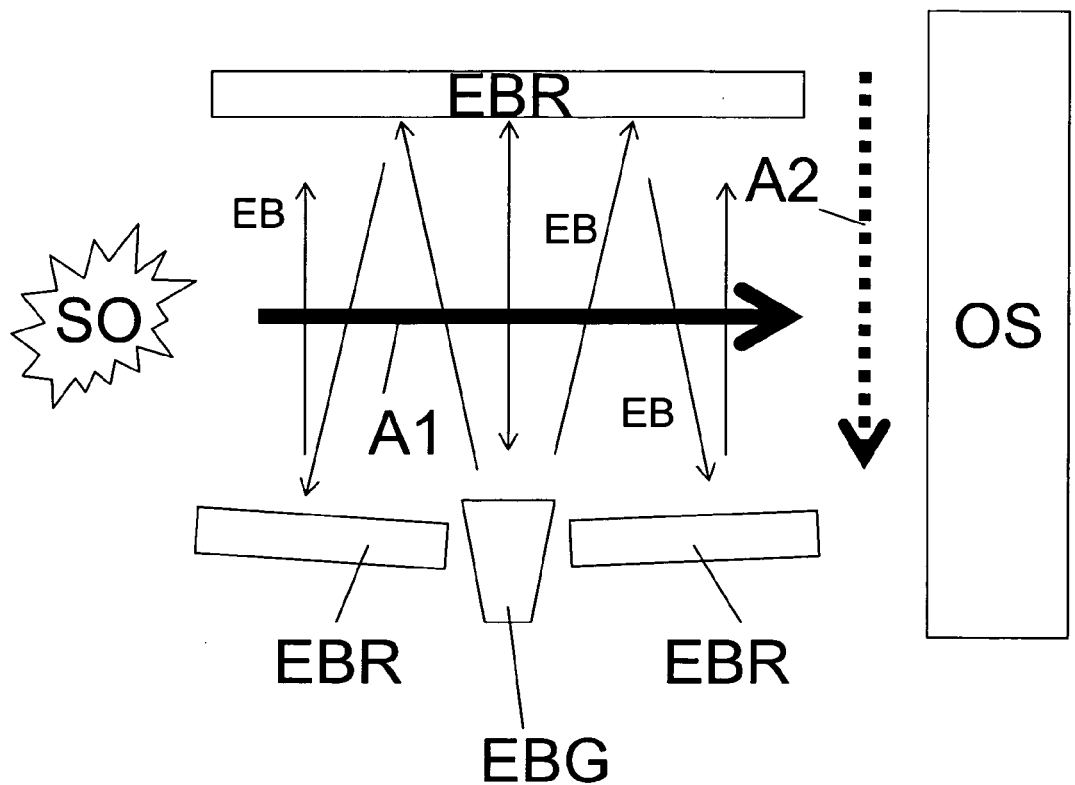
FIG. 4 schematically depicts a part of the lithographic apparatus of FIG. 1 according to an embodiment of the invention.

FIG. 4 schematically depicts a part of a lithographic apparatus according to an embodiment of the invention. In this embodiment, the debris mitigating system D includes an EB generator EBG for generating an electron beam. The electrons may ionize debris particles present in the path represented by the arrow A1 and, as such, the electron beam may charge these particles. In this embodiment, the debris mitigating system D may employ EB reflectors EBR for reflecting electrons so that the electrons after having crossed the path once, are returned back towards the path. The electron beam reflectors are oriented with respect to each other so that the electron beam is confined between the electron beam reflectors for as long as possible. The electron beam is represented by the arrows EB in FIG. 4

In this embodiment, the debris mitigating system may also include an electric and/or magnetic field generator for generating an electric and/or magnetic field, such that charged particles are deflected towards the optical system. The electric and/or magnetic field generator is not shown in FIG. 4. Any mechanism for generating an electric and/or magnetic field may be applied. The electric and/or magnetic field is, in FIG. 4, represented by the dotted arrow A2. The strength of the electric and/or magnetic field and the direction of the electric and/or magnetic field, can be chosen so that the charged debris particles are unlikely to reach the optical system. Also in the embodiments of FIG. 2 and FIG. 3, the arrow A2 is shown representing the possibility of the application of an electric and/or magnetic field, for deflecting charged particles present among the debris particles as released during generating of the radiation, or changed particles that were formed by photo-ionization.

For applying the electric and/or magnetic field, a person skilled in the art may use electrodes, magnets, permanent or electromagnets, or any other system well known in the art.

Figure 5:
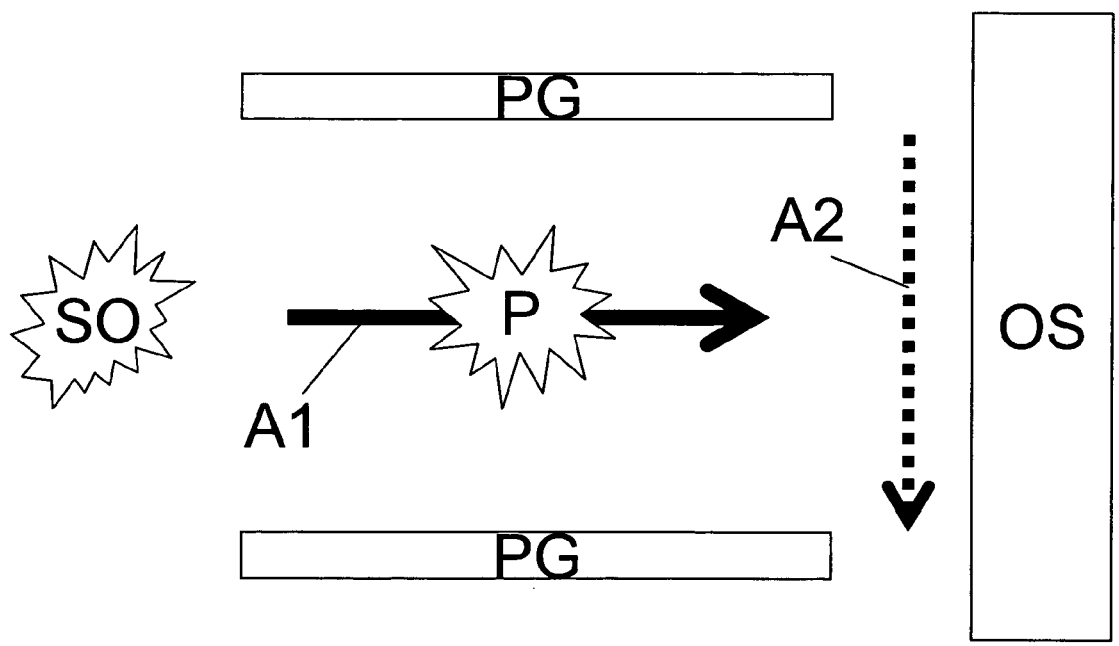
FIG. 5 schematically depicts a part of the lithographic apparatus of FIG. 1 according to an embodiment of the invention.

FIG. 5 shows a part of an embodiment of a lithographic apparatus according to the invention. In this embodiment the debris mitigating system D includes a plasma generator PG for generating a plasma P from the debris particles. In a plasma also charged particles are formed. This embodiment may also include an electric and/or magnetic field generator for generating an electric and/or magnetic field, so that charged particles are deflected towards the optical system. Useful plasma generators are well known in the art.

Figure 6:
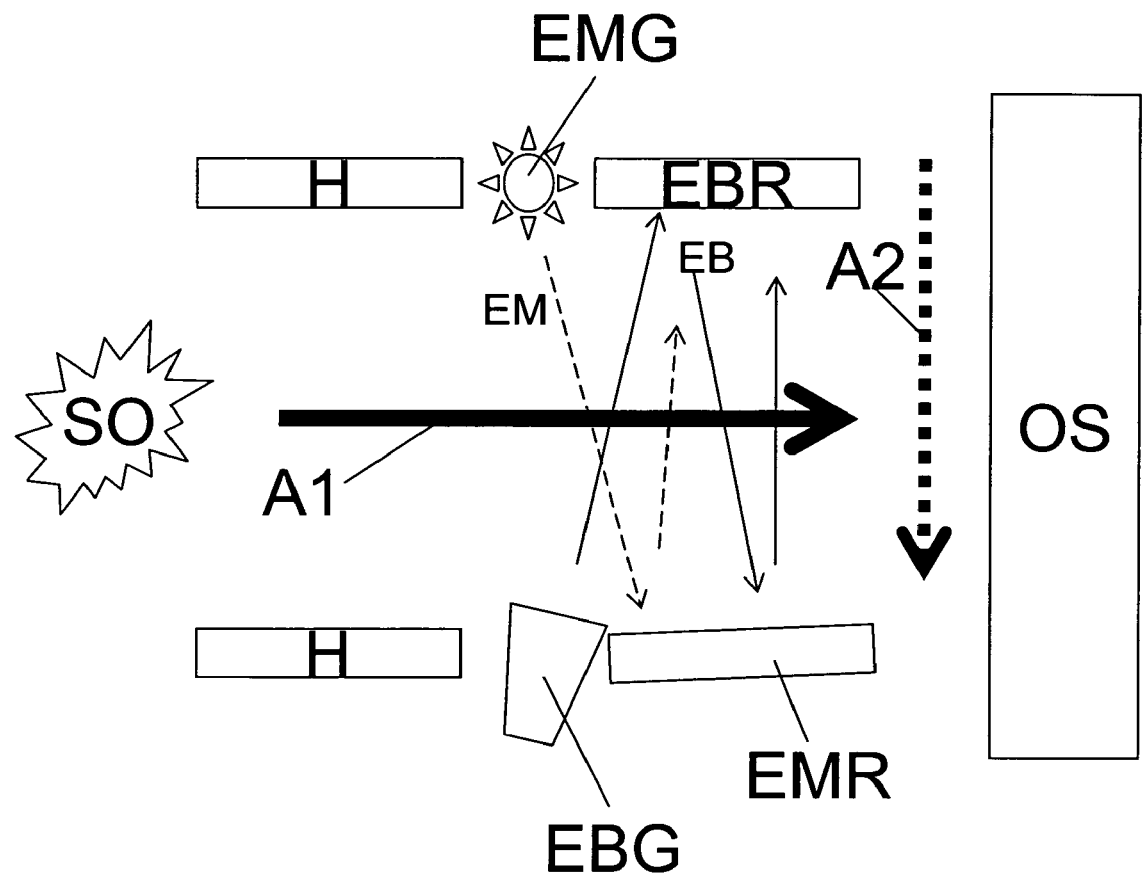
FIG. 6 schematically depicts a part of the lithographic apparatus of FIG. 1 according to an embodiment of the invention.

FIG. 6 schematically depicts a part of a lithographic apparatus according to an embodiment of the invention. In this embodiment, a part of the path along which the radiation propagates from the source SO to the optical system OS is divided in two parts I, II. In the first part, the debris mitigating system includes a heater arranged to evaporate debris particles. In the second part II, the debris mitigating system D may include an EM generator EMG and/or and EB generator EBG. The second part may also include an EB reflector and/or an electromagnetic radiation reflector EMR. In the first part of the path, the particles may be evaporated and as such become smaller particles i.e. very small molecules or atoms. In a second part of the path, these particles may be charged so as to enable the deflection by an electro and/or magnetic field.

It should be appreciated that the debris mitigating system D may capable of performing only one of (i) directly evaporating the debris particles, (ii) directly charge the debris particles, and (iii) directly producing the plasma out of the debris particles. Alternatively, combinations of the embodiments shown in FIGS. 2–5 may allow for a further optimization of the mitigating process. FIG. 6 shows an example of a feasible combination. It may, for example, be possible to combine a plasma generator with any of the other embodiments.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5–20 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An apparatus comprising:
 a source for generating radiation;
 a debris mitigating system for mitigating debris particles that are released with the generation of radiation, and
 an optical system for collecting the radiation,
 wherein the debris mitigation system is arranged to directly evaporate the debris particle in a path along which the radiation propagates from the source to the optical system.

2. An apparatus according to claim 1, wherein the debris mitigating system comprises a heater for heating the debris particles.

3. An apparatus according to claim 2, wherein the heater comprises an oven.

4. An apparatus according to claim 2, wherein the heater comprises a radiator.

5. An apparatus according to claim 1, wherein the debris mitigating system comprises an EM generator for generating electromagnetic radiation.

6. An apparatus according to claim 5, wherein the EM generator comprises a flash lamp.

7. An apparatus according to claim 5, wherein the EM generator comprises a laser.

8. An apparatus according to claim 5, wherein the EM generator comprises an I-line lamp.

9. An apparatus according to claim 5, wherein the EM generator is capable of supplying power in a range of about 100 to about 1000 watts.

10. An apparatus according to claim 5, wherein the debris mitigating system comprises EM radiation reflectors for reflecting electromagnetic radiation such that the electromagnetic radiation after having crossed the path once is returned back towards the path.

11. An apparatus according to claim 1, wherein the debris mitigation system comprises an E-beam generator for generating an electron beam to charge the debris particles.

12. An apparatus according to claim 11, wherein the debris mitigating system comprises E-beam reflectors for reflecting electrons such that the electrons after having crossed the path once are returned back towards the path.

13. An apparatus according to claim 11, wherein the debris mitigating system further comprises an electric and/or magnetic field generator for generating an electric and/or magnetic field, respectively, so that the charged particles are deflected towards the optical system.

14. An apparatus according to claim 1, wherein the debris mitigating system comprises a plasma generator for generating a plasma from the debris particles.

15. An illumination system configured to condition radiation in a lithographic apparatus, the illumination system comprising:
 a debris mitigating system for mitigating at least some debris particles that are released when the radiation is generated; and
 an optical system for collecting the radiation,
 wherein the debris mitigation system is arranged to directly evaporate the debris particles in a path along which the radiation propagates from a source generating the radiation to the optical system.

16. An illumination system according to claim 15, wherein the debris mitigating system comprises a heater for heating the debris particles.

17. An illumination system according to claim 16, wherein the heater comprises an oven.

18. An illumination system according to claim 16, wherein the heater comprises a radiator.

19. An illumination system according to claim 15, wherein the debris mitigating system comprises an EM generator for generating electromagnetic radiation.

20. An illumination system according to claim 19, wherein the EM generator comprises a flash lamp.

21. An illumination system according to claim 19, wherein the EM generator comprises a laser.

22. An illumination system according to claim 19, wherein the EM generator comprises an I-line lamp.

23. An illumination system according to claim 19, wherein the EM generator is capable of supplying power in a range of about 100 to about 1000 watts.

24. An illumination system according to claim 19, wherein the debris mitigating system comprises EM radiation reflectors for reflecting electromagnetic radiation such that the electromagnetic radiation after having crossed the path once is returned back towards the path.

25. An illumination system according to claim 15, wherein the debris mitigation system comprises an E-beam generator for generating an electron beam to charging the debris particles.

26. An illumination system according to claim 25, wherein the debris mitigating system comprises E-beam reflectors for reflecting electrons such that the electrons after having crossed the path once are returned back towards the path.

27. An illumination system according to claim 25, wherein the debris mitigating system further comprises an electric and/or magnetic field generator for generating an electric and/or magnetic field, respectively, so that the charged particles are deflected towards the optical system.

28. An illumination system according to claim 15, wherein the debris mitigating system comprises a plasma generator for immersing the debris particles in a plasma.

29. A method for mitigating at least some debris particles released during generation of radiation in a path along which the radiation propagates from a radiation source to an optical system, wherein the method comprises directly evaporating the debris particles in the path.

30. A method according to claim 29, wherein said evaporating comprises heating the debris particles.

31. A method according to claim 30, wherein said heating comprises using an oven.

32. A method according to claim 30, wherein said heating comprises using radiation.

33. A method according to claim 29, wherein said evaporating comprises generating electromagnetic radiation.

34. A method according to claim 33, wherein said generating comprises using a flash lamp.

35. A method according to claim 33, wherein said generating comprises using a laser.

36. A method according to claim 33, wherein said generating comprises using an I-line lamp.

37. A method according to claim 33, wherein said evaporating comprises supplying to the debris particles power in a range of about 100 to about 1000 watts.

38. A method according to claim 33, wherein said generating comprises reflecting the electromagnetic radiation such that the electromagnetic radiation after having crossed the path once is returned back towards the path.

39. A method according to claim 33, further comprising charging the debris particles, wherein said charging comprises generating an electron beam.

40. A method according to claim 39, wherein said charging comprises reflecting electrons such that the electrons after having crossed the path once are returned back towards the path.

41. A method according to claim 39, wherein the method further comprises generating an electric and/or magnetic field so that the charged particles are deflected towards the optical system.

42. A method according to claim 29, further comprising producing a plasma out of the debris particles, wherein said producing comprises generating the plasma from the debris particles.

43. A lithographic apparatus comprising:
   a source for generating radiation;
   a debris mitigating system for mitigating debris particles that are released with the generation of radiation;
   an optical system for collecting the radiation,
   an illumination system for conditioning the radiation;
   a patterning device for patterning the conditioned radiation; and
   a projection system for projecting the patterned radiation onto a target portion of a substrate,
   wherein the debris mitigation system is arranged to directly evaporate the debris particles, in a path along which the radiation propagates from the source to the optical system.

* * * * *